United States Patent [19]
Rösner et al.

[11] Patent Number: 5,432,115
[45] Date of Patent: Jul. 11, 1995

[54] PROCESS FOR MAKING A CONTACT BETWEN A CAPACITOR ELECTRODE DISPOSED IN A TRENCH AND AN MOS TRANSISTOR SOURCE/DRAIN REGION DISPOSED OUTSIDE THE TRENCH

[75] Inventors: Wolfgang Rösner, München; Franz Hofmann, Sünching; Lothar Risch, Neubiberg, all of Germany

[73] Assignee: Siemens Aktiengesellschaft, Munich, Germany

[21] Appl. No.: 284,502
[22] PCT Filed: Feb. 1, 1993
[86] PCT No.: PCT/DE93/00078
  § 371 Date: Aug. 4, 1994
  § 102(e) Date: Aug. 4, 1994
[87] PCT Pub. No.: WO93/16490
  PCT Pub. Date: Aug. 19, 1993

[30] Foreign Application Priority Data
Feb. 13, 1992 [DE] Germany ............... 42 04 298.4

[51] Int. Cl.⁶ ....................................... H01L 21/8242
[52] U.S. Cl. ......................................... 437/60; 437/47; 437/52; 437/919
[58] Field of Search ................ 437/47, 48, 52, 60, 437/919; 257/303

[56] References Cited

U.S. PATENT DOCUMENTS

| | | | |
|---|---|---|---|
| 4,734,384 | 3/1988 | Tsuchiya | 437/52 |
| 4,967,248 | 10/1990 | Shimizu . | |
| 4,999,312 | 3/1991 | Yoon | 437/52 |
| 5,262,002 | 11/1993 | Grewal et al. | 437/52 |

FOREIGN PATENT DOCUMENTS

| | | |
|---|---|---|
| 0399060 | 11/1990 | European Pat. Off. . |
| 59-63757 | 4/1984 | Japan . |
| 62-247560 | 10/1987 | Japan . |
| 63-260163 | 10/1988 | Japan . |
| 63-45868 | 9/1989 | Japan . |

OTHER PUBLICATIONS

"Technologies for Megabit DRAMs", Wolfgang Müller et al, Archiv Fur Elektronik und Ubertragungstechnik, vol. 44, No. 3, May 1990, pp. 200–207.

"Buried Stacked Capacitor Cells for 16M and 64M DRAMS", J. Dietl et al, ESSDERC 90, Sep. 1990, pp. 465–468.

*Primary Examiner*—Tom Thomas
*Attorney, Agent, or Firm*—Hill, Steadman & Simpson

[57] ABSTRACT

To make a contact between a capacitor electrode (13) disposed in a trench (11) and an MOS transistor source/drain region disposed outside the trench, a shallow etching is carried out in a self-aligned manner with respect to a field-oxide region insulating the MOS transistor by producing the trench (11) in a substrate (1). After forming an $Si_3N_4$ spacer (10) at the edge (8), laid bare during the etching, of the substrate (1) the part laid bare of the field-oxide region (2) is first removed with the aid of a mask and the trench (11) is completed in a further etching. The contact is produced after the formation of an $SiO_2$ layer (12) at the surface of the trench (11) after removing the $Si_3N_4$ spacer (10) and producing the capacitor electrode (13) at the edge (8), laid bare by removing the $Si_3N_4$ spacer (10), of the substrate (1).

8 Claims, 4 Drawing Sheets

PROCESS FOR MAKING A CONTACT BETWEN A CAPACITOR ELECTRODE DISPOSED IN A TRENCH AND AN MOS TRANSISTOR SOURCE/DRAIN REGION DISPOSED OUTSIDE THE TRENCH

BACKGROUND OF THE INVENTION

To design 16M and 64M DRAM circuits, storage cells are needed which have a small space requirement and can be disposed in a substrate with high packing density. Such a storage cell concept is known in the form of the ISTT (Isolated Stack in Trench) DRAM cell and of the BSCC (Buried stacked capacitor cell). This storage cell has a transistor and a capacitor. The capacitor is disposed with both capacitor electrodes and the dielectric in a trench, the capacitor being insulated from the substrate by an oxide layer disposed at the trench surface (see, for example, J. Dietl et al., ESSDERC 90, pages 465 to 468).

In this cell concept it is necessary to make an electrical contact between the transistor source/drain region and the capacitor electrode, which is disposed in the trench and insulated from the substrate and on which the charge corresponding to the information is stored. Two possibilities of making the contact are disclosed in the literature (see J. Dietl, ESSDERC 90, pages 465 to 468):

After the trench has been etched, its surface is provided with an $SiO_2$ layer. The trench is then filled with photoresist. The size of the contact on the edge of the trench adjacent to the transistor is defined by re-exposing the photoresist down to the specified depth. This exposure of the photoresist depth is only poorly reproducible. In the process, variations of around 1 $\mu$m occur. With this process it is therefore not possible to open the contact only with respect to the subsequent source/drain region. A contact opening to parts of the substrate disposed underneath the source/drain region also inevitably results. This results in punch-through and leakage currents.

Alternatively, a shallow trench etching is first carried out. An $Si_3N_4$ spacer is formed at the edge adjacent to the source/drain region. A further trench etching follows in which the final depth of the trench is reached. The surface of the trench is then provided with an $SiO_2$ layer. The contact to the source/drain region is opened by stripping the $Si_3N_4$ spacer. The depth of the contact is established by means of the depth of the shallow etching. In the shallow etching, it is necessary to ensure that the substrate is not laid bare on the side of the trench produced which is remote from the source/drain region and at which the storage cell is insulated from adjacent active regions by a field-oxide region. If this is not so, a contact to the substrate, which impairs the insulation between the cells, is produced on this side.

In both the known processes, a further photolithographic procedure is needed to define the position of the contact in addition to the photo-lithographic procedure for patterning the trench.

SUMMARY OF THE INVENTION

The invention therefore proceeds from the problem of providing a process for making a contact between a capacitor electrode disposed in a trench and an MOS transistor source/drain region disposed outside the trench, in which process the depth of the contact can be satisfactorily controlled and, at the same time, reliable insulation is ensured between adjacent active regions.

This problem is solved, according to the invention, by a process having the following steps. At least one field-oxide region is formed in a substrate Si to the side of the source/drain region as insulation from adjacent active regions in the substrate. A trench mask is produced which defines the position of the trench to the side of the source/drain region on the side of the field-oxide region adjacent to the source/drain region such that the trench is arranged between the source/drain region and the field-oxide region. The trench mask leaves the field-oxide region partially uncovered on the side adjacent to the source/drain region. A photoresist is arranged on the surface of the trench mask. A first etching is carried out to produce the trench to a first depth in the substrate, which attacks the substrate selectively on photoresist and the field-oxide region, so that the trench mask covered with photoresist and the part of the field-oxide region laid bare act as an etching mask. A vertical substrate edge is laid bare at the side of the trench adjacent to the source/drain region. A conformal $Si_3N_4$ layer is deposited after removal of the photoresist. Spacers of $Si_3N_4$ are formed from the conformal $Si_3N_4$ layer at the vertical edges by anisotropic etching and the part of the field-oxide region laid bare is selectively etched away to form the trench mask. A second etching is carried out to a second depth in the substrate, the cross section of the trench being defined by the trench mask and the depth of the trench by the second depth. The surface of the trench is provided with an $SiO_2$ layer. The $Si_3N_4$ spacers are removed selectively with respect to the $SiO_2$ and Si. The capacitor electrode is produced in the trench in such a way that it covers at least the vertical substrate edge laid bare during the etching. On the side of the trench which is remote from the field-oxide region, a source/drain region adjoining the capacitor electrode is produced.

Further developments of the invention are as follows. The field-oxide region is produced in a LOCOS process. To produce the trench mask, a first $SiO_2$ layer, which is thinner than the field-oxide region, is deposited on the substrate provided with the field-oxide region. An $Si_3N_4$ layer is deposited on the first $SiO_2$ layer. A second $SiO_2$ layer is deposited on the $Si_3N_4$ layer. A polysilicon layer is deposited on the second $SiO_2$ layer. A photoresist mask which defines the cross section of the trench parallel to the substrate surface is produced on the polysilicon layer. The polysilicon layer, the second $SiO_2$ layer, the $Si_3N_4$ layer and the first $SiO_2$ layer are each patterned in an anisotropic dry etching step using the photoresist mask as etching mask so that the surface of the substrate is laid bare to the side of the field-oxide region. The photoresist mask is removed after the first etching to produce the trench.

The first $SiO_2$ layer is produced by thermal oxidation of the surface of the substrate and in which the second $SiO_2$ layer is produced by CVD deposition after decomposing $Si(OC_2H_5)_4$.

The first $SiO_2$ layer is produced with a thickness of between 10 nm and 40 nm, the $Si_3N_4$ layer with a thickness of between 20 nm and 60 nm, the second $SiO_2$ layer with a thickness of between 200 nm and 1,000 nm and the polysilicon layer with a thickness of between 20 nm and 100 nm.

The conformal $Si_3N_4$ layer is deposited with a thickness of between 10 nm and 100 nm to form the $Si_3N_4$ spacers (10).

The Si$_3$N$_4$ spacers are removed by wet-chemical etching.

The first depth assumes a value of between 30 nm and 300 nm and the second depth a value between 2 μm and 20 μm.

In the process according to the invention, the depth of the contact is established by the first depth of the first etching.

The first etching is carried out using the trench mask and the part laid bare of the field-oxide region as etching mask. It is only after the formation of the Si$_3$N$_4$ spacer at the substrate edge which is laid bare during the first etching and at which the contact is made that the part of the field oxide laid bare is removed and the trench is completed by a further etching. In this way, it is only after the Si$_3$N$_4$ spacer has been made that substrate material can be laid bare at the sides of the trench which are adjacent to the field-oxide region. The substrate material is then provided with SiO$_2$ during the formation of the insulating SiO$_2$ layer at the surface of the trench.

In the process according to the invention, the depth of the contact can therefore be established regardless of the thickness of the field-oxide region. Furthermore, good insulation of the trench from adjacent active regions in the substrate is ensured. The first etching is carried out in a self-aligned manner with respect to the field-oxide region, as a result of which a photolithographic procedure for defining the contact is unnecessary.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

The invention is explained in greater detail below.

DESCRIPTION OF THE PREFERRED EMBODIMENT

Figure 1:
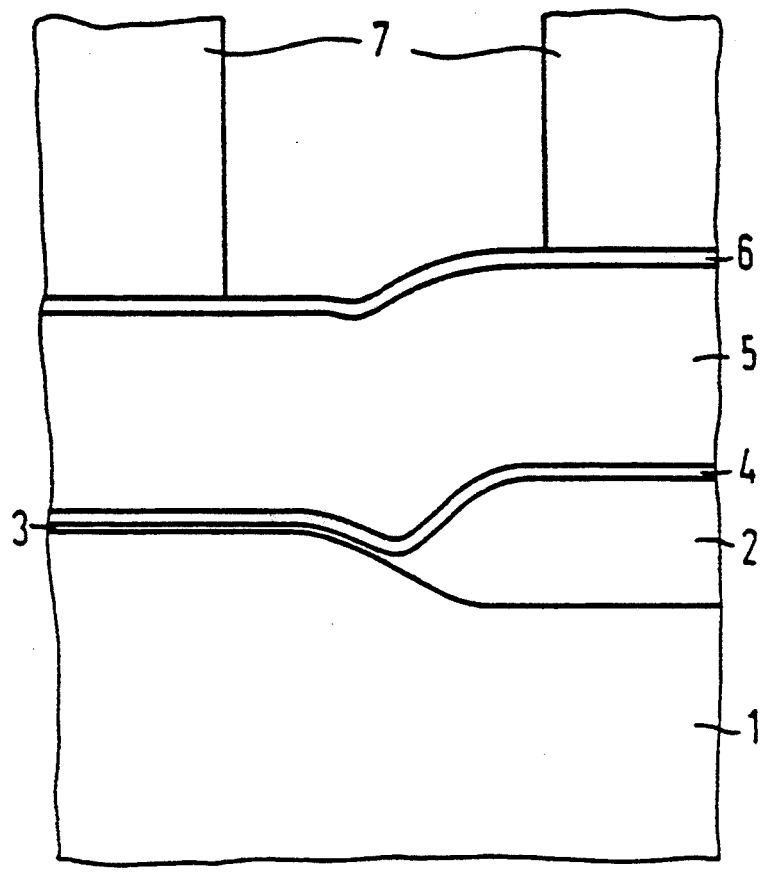
FIG. 1 shows the production of the trench mask.
Figure 2:
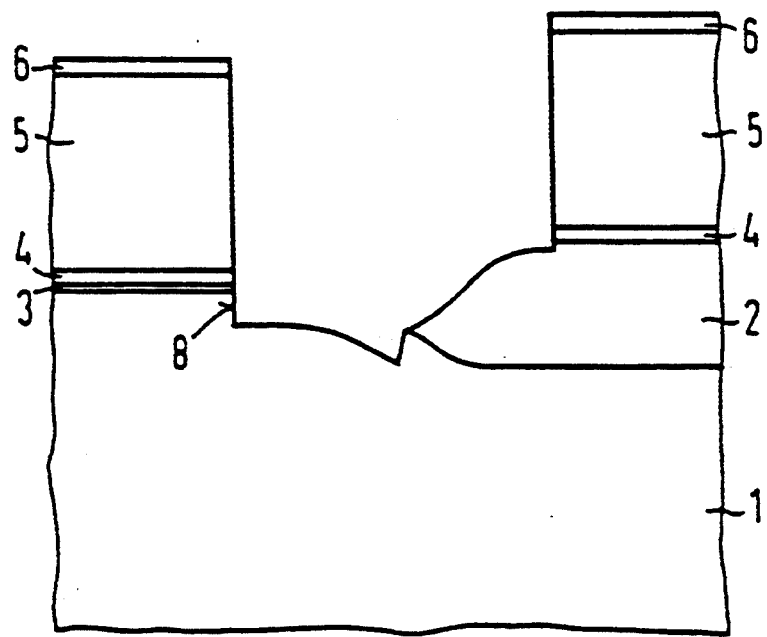
FIG. 2 shows the structure after the first etching.
Figure 3:
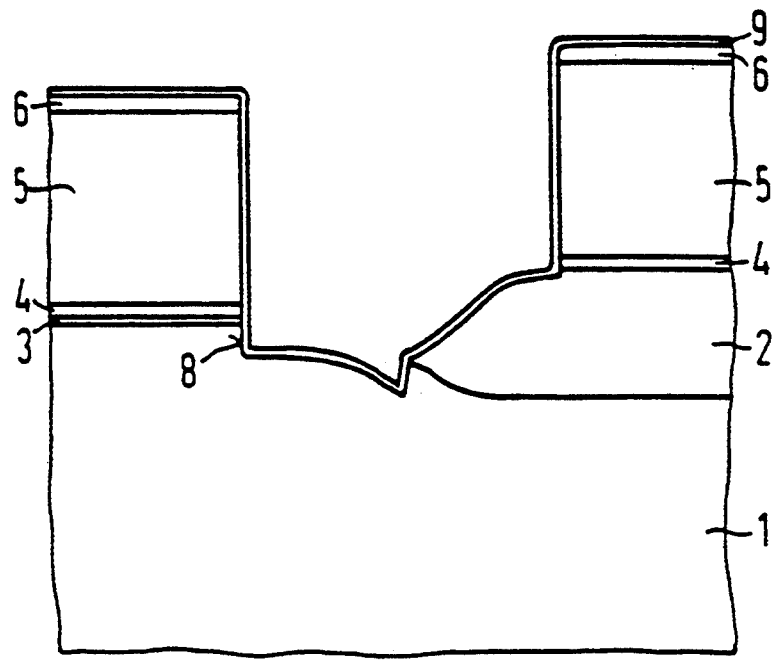
FIG. 3 shows the production of Si$_3$N$_4$ spacers.
Figure 4:
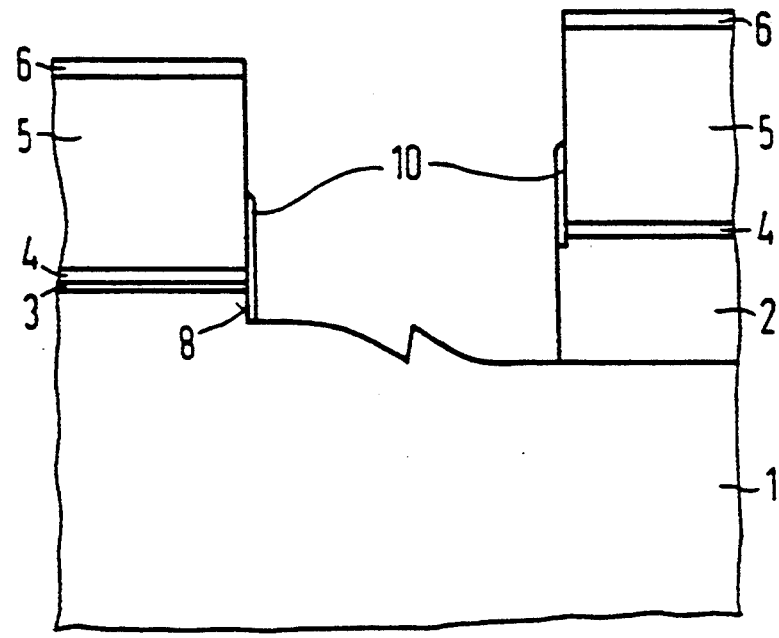
FIG. 4 shows the structure after removing the parts of the field-oxide region which are laid bare.
Figure 5:
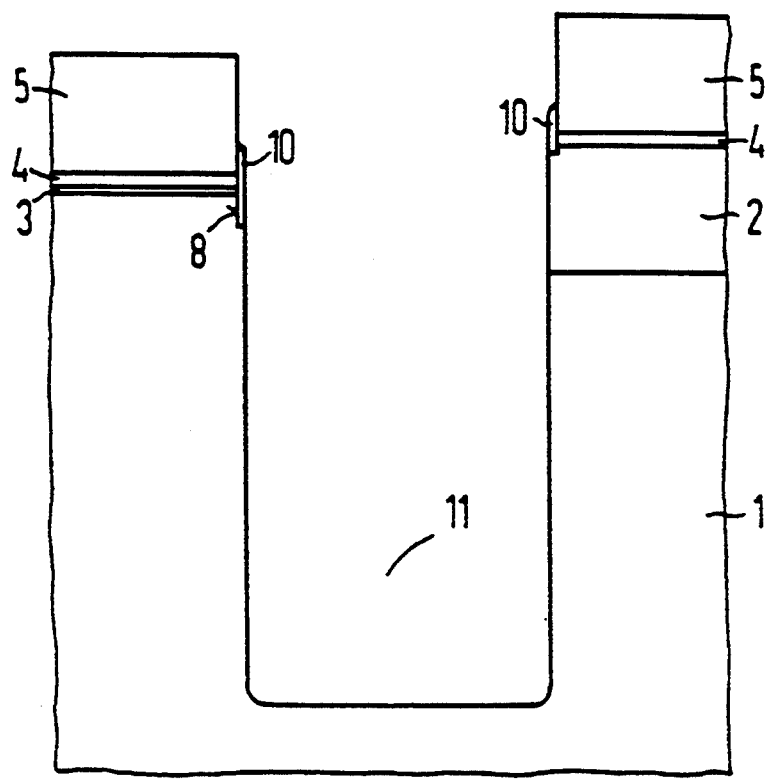
FIG. 5 shows the structure after completion of the trench.

FIGS. 1–7 are not drawn to scale.

Wells for accommodating MOS transistors (not shown) are produced in a known manner in a substrate 1 composed of, for example, p-doped single-crystal silicon. At least one field-oxide region 2 is produced in a LOCOS process (not shown in detail) (see FIG. 1). The field-oxide region 2 is used as insulation between adjacent active regions in the substrate 1.

To make a mask for a trench etching, a first SiO$_2$ layer 3 is produced over the entire surface, for example, by thermal oxidation. The first SiO$_2$ layer 3 is produced with a thickness of, for example, 24 nm. An Si$_3$N$_4$ layer 4 having a thickness of, for example, 40 nm is deposited on the first SiO$_2$ layer 3. A second SiO$_2$ layer 5 having a thickness of, for example, 600 nm is produced on the Si$_3$N$_4$ layer 4 by decomposing Si(OC$_2$H$_5$)$_4$ (TEOS). A polysilicon layer 6 having a thickness of, for example, 50 nm is produced on the second SiO$_2$ layer 5.

A photoresist mask 7 is produced at the surface of the polysilicon layer 6 from a photoresist layer by exposure and development. The photoresist mask 7 defines the position of a trench etching. The photoresist mask 7 leaves the field-oxide region 2 partially uncovered on the side at which the source/drain region is subsequently produced. The opening of the photoresist mask 7 extends into the region of the substrate 1 which is not covered by the field-oxide region 2 and in which the transistor source/drain region is subsequently produced.

In a dry etching process, for example using Cl$_2$ and He, the polysilicon layer 6 is patterned using the photoresist mask 7 as an etching mask. This lays bare the surface of the second SiO$_2$ layer 5.

In a dry etching process, for example using CHF$_3$ and O$_2$, in which the selectivity (TEOS:nitride) is adjusted to 1.8:1, the second SiO$_2$ layer 5 is patterned using the photoresist mask 7 as etching mask, in which process the surface of the Si$_3$N$_4$ layer 4 is laid bare.

In a dry etching process, for example using CHF$_3$ and O$_2$, in which the selectivity (nitride:thermal oxide) is adjusted to 3.2:1, the Si$_3$N$_4$ layer 4 is patterned using the photoresist mask 7 as etching mask. The first SiO$_2$ layer 3 is patterned in the same dry etching process, the photoresist mask 7 acting as etching mask. In this process, the surface is slightly eroded in the part of the field-oxide region 2 laid bare. The surface of the substrate 1 is laid bare, however, only outside the field-oxide region 2.

In a dry etching process, for example using HBr, He, O$_2$ and NF$_3$, a first etching of the substrate 1 to produce the trench is carried out. The first etching takes place, for example, to a first depth of 100 nm. In the first etching, the photoresist mask 7 and the area of the field-oxide region 2 laid bare jointly act as an etching mask. During the first etching, the substrate 1 is therefore attacked only to the side of the field-oxide region 2 (see FIG. 2). In this process, a vertical substrate edge 8 is laid bare on the side remote from the field oxide 2. The first depth of the first etching determines the size of the vertical substrate edge 8 in the direction perpendicular to the substrate surface. A contact between a capacitor electrode disposed in a trench and an MOS transistor source/drain region disposed outside the trench is subsequently formed at the vertical substrate edge 8 laid bare in the first etching.

After the first etching, the photoresist mask 7 is removed.

There follows the deposition of a conformal Si$_3$N$_4$ layer 9. The conformal Si$_3$N$_4$ layer 9 is deposited over the entire surface with a thickness of, for example, 40 nm (see FIG. 3).

In a dry etching process, for example using CHF$_3$ and O$_2$, the nonvertical parts of the conformal Si$_3$N$_4$ layer 9 are removed.

Using the polysilicon layer 6 as a mask, the part of the field-oxide region 2 laid bare is etched away in the same dry etching process. At vertical edges, inter alia also at the vertical substrate edge 8 laid bare, there are formed, during this process, Si$_3$N$_4$ spacers 10 which reliably cover the vertical substrate edge 8 which is laid bare during the first etching and which is situated at the side remote from the field-oxide region 2.

In the next step, the substrate 1 is etched to produce a trench 11. In this process, the patterned second $SiO_2$ layer 5 acts as an etching mask. The etching is carried out anisotropically, for example using HBr, He, $O_2$ and $NF_3$. The trench 11 is produced with a depth of, for example, 5 μm. In this process, the patterned polysilicon layer 6 at the surface of the second $SiO_2$ layer 5 is removed.

The remaining residue of the second $SiO_2$ layer 5 used as etching mask is removed, for example, by etching with dry HF gas.

Figure 6:
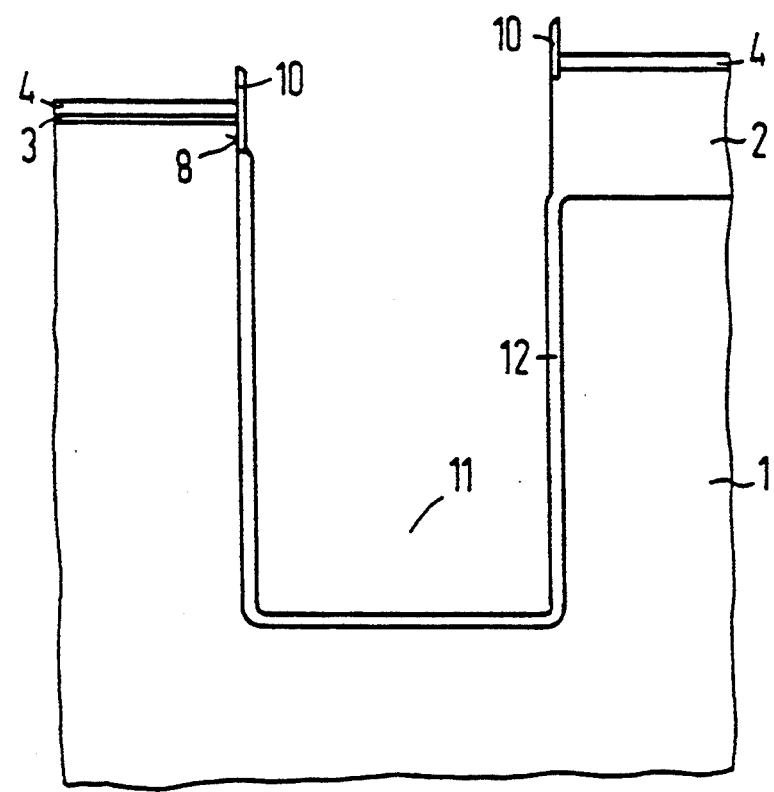
FIG. 6 shows the structure after producing the insulating SiO$_2$ layer in the trench.

A third $SiO_2$ layer 12 having a thickness of, for example, 40 nm is produced by, for example, thermal oxidation at the surface of the trench 11 (see FIG. 6). The third $SiO_2$ layer 12 insulates the interior of the trench, with the exception of the region of the vertical substrate edge 8, covered by the $Si_3N_4$ spacer 10, from the substrate 1.

The remaining $Si_3N_4$ spacers 10 and the patterned $Si_3N_4$ layer 4 are removed by wet-chemical etching, for example using $H_3PO_4$ heated to 155° C. In this process, the vertical substrate edge 8 is laid bare.

Figure 7:
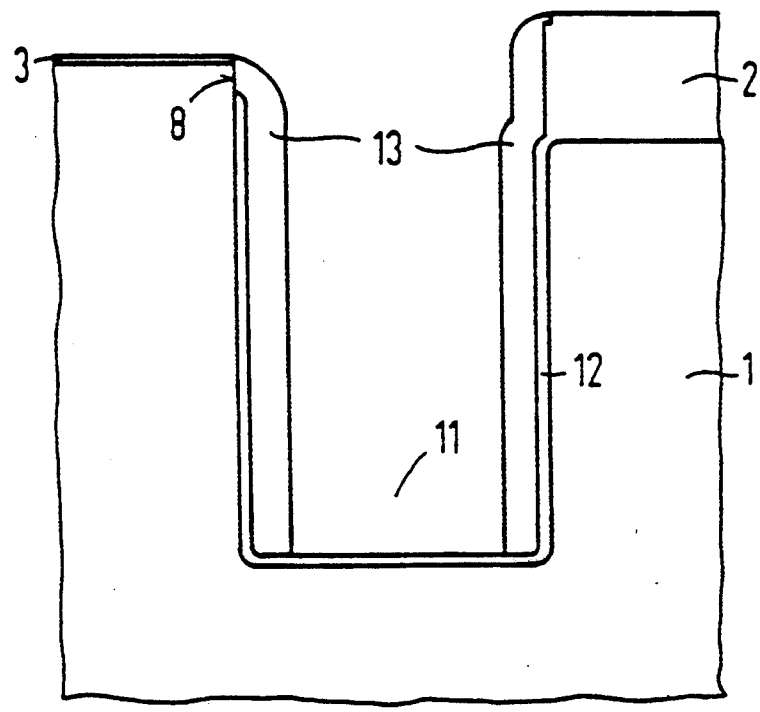
FIG. 7 shows the structure after opening the contact and producing the capacitor electrode.

A capacitor electrode 13 which covers the edges of the trench 11 is completed by conformal deposition and subsequent anisotropic back-etching of a polysilicon layer (see FIG. 7).

In the region of the vertical substrate edge 8 which was covered by an $Si_3N_4$ spacer during the oxidation of the surface of the trench 11, the capacitor electrode 13 is in contact with the substrate 1. An MOS transistor source/drain region is subsequently formed in this region of the substrate 1. The capacitor electrode 13 is insulated by the third $SiO_2$ layer 12 from the substrate 1 outside the vertical substrate edge 8.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed:

1. A process for making a contact between a capacitor electrode in a trench and an MOS transistor source/drain region that is outside the trench, comprising the steps of:
    forming at least one field-oxide region in a substrate adjacent to an area for the source/drain region, the at least one field-oxide region insulating the source/drain region from neighboring active regions in the substrate;
    producing a trench mask having an opening that defines a shape of a trench to be produced, the opening leaving the field-oxide region partially uncovered at a side thereof adjacent to the area for the source/drain region, the opening also extending into the area for the source/drain region, the trench mask having a photoresist as a covering layer;
    carrying out a first etching to produce the trench to a first depth in the substrate, the trench mask covered with photoresist and the uncovered part of the field-oxide region acting as an etching mask, a vertical substrate edge being uncovered at a side of the opening in the trench mask, that faces toward the area for the source/drain region;
    removing the photoresist;
    depositing a conformal $Si_3N_4$ layer over the entire surface;
    forming $Si_3N_4$ spacers at vertical substrate sidewalls from the conformal $Si_3N_4$ layer by anisotropic etching, the anisotropic etching also etching off the uncovered part of the field-oxide region within the opening of the trench mask;
    carrying out a second etching to a second depth in the substrate, a cross section of the trench being defined by the opening in the trench mask and a depth of the trench being defined by the second depth;
    providing the surface of the trench with an $SiO_2$ layer;
    selectively removing the $Si_3N_4$ spacers with respect to the $SiO_2$ layer and the substrate;
    producing a capacitor electrode in the trench such that the capacitor electrode covers at least the vertical substrate sidewalls that were uncovered by removal of the $Si_3N_4$ spacers; and
    generating a source/drain region in the area for the source/drain region at a side of the trench facing away from the field-oxide region.

2. The process according to claim 1, wherein the field-oxide region is produced in a LOCOS process.

3. The process according to claim 1 wherein to produce the trench mask, a first $SiO_2$ layer, which is thinner than the field-oxide region, is deposited on the substrate provided with the field-oxide region, wherein an $Si_3N_4$ layer is deposited on the first $SiO_2$ layer, wherein a second $SiO_2$ layer is deposited on the $Si_3N_4$ layer, wherein a polysilicon layer is deposited on the second $SiO_2$ layer, wherein a photoresist mask which determines the opening defines the shape of the trench is produced on the polysilicon layer, wherein the polysilicon layer, the second $SiO_2$ layer, the $Si_3N_4$ layer and the first $SiO_2$ layer are each patterned in an anisotropic dry etching step using the photoresist mask as an etching mask so that a surface of the substrate that is adjacent to the field-oxide region is uncovered, and wherein the photoresist mask is removed after the first etching.

4. The process according to claim 3, in which the first $SiO_2$ layer is produced by thermal oxidation of the surface of the substrate and in which the second $SiO_2$ layer is produced by CVD deposition after decomposing $Si(OC_2H_5)_4$ (TEOS).

5. The process according to claim 4, wherein the first $SiO_2$ layer is produced with a thickness of between 10 nm and 40 nm, the $Si_3N_4$ layer is produced with a thickness of between 20 nm and 60 nm, the second $SiO_2$ layer is produced with a thickness of between 200 nm and 1,000 nm and the polysilicon layer is produced with a thickness of between 20 nm and 100 nm.

6. The process according to claim 1, wherein the conformal $Si_3N_4$ layer is deposited with a thickness of between 10 nm and 100 nm to form the $Si_3N_4$ spacers.

7. The process according to claim 1, wherein the $Si_3N_4$ spacers are removed by wet-chemical etching.

8. The process according to claim 1, wherein the first depth has a value of between 30 nm and 300 nm and the second depth has a value between 2 μm and 20 μm.

* * * * *